United States Patent [19]

Marchant et al.

[11] Patent Number: 4,593,306
[45] Date of Patent: Jun. 3, 1986

[54] INFORMATION STORAGE MEDIUM AND METHOD OF RECORDING AND RETRIEVING INFORMATION THEREON

[75] Inventors: D. D. Marchant, Richland, Wash.; Stefan Begej, Amherst, Mass.

[73] Assignee: Battelle Development Corporation, Columbus, Ohio

[21] Appl. No.: 469,337

[22] Filed: Feb. 24, 1983

[51] Int. Cl.$^4$ ...................... H01L 27/04; G11C 11/40
[52] U.S. Cl. ........................................ 357/45; 357/2; 357/29; 357/68; 365/114
[58] Field of Search .................. 357/28, 29, 30, 2, 68, 357/91, 63, 45; 148/DIG. 93; 365/103, 105, 114, 115

[56] References Cited

U.S. PATENT DOCUMENTS

| | | | |
|---|---|---|---|
| 3,716,844 | 2/1973 | Brodsky | 357/2 |
| 3,771,026 | 11/1973 | Asai et al. | 357/68 |
| 3,865,975 | 2/1975 | Fletcher et al. | 178/7.1 |
| 3,902,010 | 8/1975 | Goshima | 178/6.7 |
| 3,983,542 | 9/1976 | Ovshinsky | 357/2 |
| 4,128,897 | 12/1978 | Norton et al. | 365/118 |
| 4,203,781 | 5/1980 | Miller | 357/91 |
| 4,238,694 | 12/1980 | Kimerling et al. | 357/29 |
| 4,240,843 | 12/1980 | Celler et al. | 357/91 |

FOREIGN PATENT DOCUMENTS 54-24574 2/1979 Japan .................... 357/91

OTHER PUBLICATIONS

Celler et al., "Spatially Controlled Crystal Regrowth of Ion-Implanted Silicon by Laser Irradiation," Appl. Phys. Lett. 32(8), 4/15/78.
Japanese Journal of Applied Physics, vol. 20, No. 4, Apr., 1981, pp. L293-295-"A Novel Method of Electron Beam Recording on a Si Wafer", by Munakata and Miyazaki.

Primary Examiner—William D. Larkins
Assistant Examiner—E. Fallick
Attorney, Agent, or Firm—Seidel, Gonda, Goldhammer & Abbott

[57] ABSTRACT

Information storage medium comprising a semiconductor doped with first and second impurities or dopants. Preferably, one of the impurities is introduced by ion implantation. Conductive electrodes are photolithographically formed on the surface of the medium. Information is recorded on the medium by selectively applying a focused laser beam to discrete regions of the medium surface so as to anneal discrete regions of the medium containing lattice defects introduced by the ion-implanted impurity. Information is retrieved from the storage medium by applying a focused laser beam to annealed and non-annealed regions so as to produce a photovoltaic signal at each region.

3 Claims, 6 Drawing Figures

INFORMATION STORAGE MEDIUM AND METHOD OF RECORDING AND RETRIEVING INFORMATION THEREON

BACKGROUND OF THE INVENTION

The present invention is directed to an information storage medium and the method for recording and retrieving information thereon.

Optical disk digital record/playback systems wherein digital information is stored (recorded) and played back (retrieved) from a disk shaped storage medium are known in the art. Such systems are important in meeting the need for a digital mass memory system that is capable of storing large numbers of bits of information, for example $10^{13}$ bits, with very high data transfer rates such as 400 megabits per second. Numerous attempts have been made to produce a memory system having such capacity and speed but without success. Generally, the approaches to designing such systems have been limited to inducing reflective or transmissive changes in the optical recording medium. Laser beams are generally used for recording information on the disk, and reflected laser light is generally used for retrieving the information.

Various systems have been proposed for recording information on photosensitive materials. For example, U.S. Pat. No. 4,128,897 issued Dec. 5, 1978 to Norton et al discloses a photosensitive storage medium comprising a doped semiconductor p-type substrate covered by an n-type semiconductor layer. The n-type semiconductor layer is in turn covered by a non-doped layer. The doped and non-doped layers must be capable of eutectic formation. The non-doped layer is biased with respect to the substrate so as to produce a back-biased junction between the p- and n-type semiconductor sandwich. Information is recorded on the medium by a focused beam, either laser or electron, which heats the non-doped layer and the n-type semiconductor layer to form a eutectic alloy between the two. Information is retrieved from the medium by applying a focused electron beam so as to produce high current flow due to hole migration at the unalloyed sites and low current flow at the alloyed sites.

U.S. Pat. No. 3,902,010 issued Aug. 26, 1975 to Goshima also discloses a photosensitive storage medium. The medium comprises a glass substrate covered by a highly photosensitive chalcogen glass. The highly photosensitive glass is in turn covered by a chalcogen glass having a lesser photosensitivity. The chalcogen layers are separated by a metal film. The high sensitivity chalcogen layer is separated from the substrate by another metal film. Two laser beams, one steady and one modulated are required. The modulated beam is flanked by the steady beam. The modulated beam sensitizes the highly photosensitive chalcogen glass but not the lower sensitivity chalcogen glass. The steady beam sensitizes both layers of chalcogen glass and produces two diffused regions flanking the region irradiated by the modulated beam. Metal is diffused into the chalcogen glass so as to form a region insensitive to alkali. Post-treatment is required wherein the medium is treated with an alkaline liquid so as to remove the unexposed portions of the chalcogen glass. Alternatively, the exposed portions of the chalcogen glass may be removed by post-treatment methods.

U.S. Pat. No. 3,865,975 issued Feb. 11, 1975 to Fletcher et al discloses a photosensitive storage medium comprising a photoconductive semi-conductor film with high concentrations of hole and electron traps, both of which are deep traps. The photoconductive semiconductor film is sandwiched between transparent conductive plates which are electrically biased. To record information, energy is applied in excess of the energy gap between the conductive and valence bands. To retrieve information, energy is applied at a level below the band gap but in excess of the energy band of the trapped electrons and/or the trapped holes so as to de-trap the electrons and holes and excite the electrons and holes into the conduction band and valence band.

A system for recording information on a storage medium by means of radiation damage has also been proposed by Munakata and Miyazaki, Japanese Journal of Applied Physics, Vol. 20, No. 4, April, 1981, pp. L293–L295. In this system, the storage medium comprises a doped p-type Si wafer having a $SiO_2$ film cover. The medium does not employ a p-n junction. An electron beam produces radiation damage in the p-type layer. Other particle beams, such as a X-ray beam, are also proposed for introducing the radiation damage. The irradiated areas of the medium are less conductive than the non-irradiated areas. Information is retrieved by applying a chopped photon beam to the medium and detecting differences in the surface photovoltage. Information may be erased from the medium by heating the medium so as to remove the radiation damage.

To my knowledge, no one has heretofore proposed the use of a non-annealed semiconductor doped with a first impurity and ion implanted with a second impurity for the recordal and retrieval of digital information. In particular, it has not been proposed to record information on such a medium by selectively annealing discrete, localized regions of the medium. By annealing is meant the application of energy to re-order displaced atoms in the medium. Such atom displacement or lattice defects are known to occur as a result of ion implantation.

SUMMARY OF THE INVENTION

Briefly, the invention includes the recording of information on a non-annealed storage medium comprising a doped semiconductor having a portion containing first and second impurities by selectively annealing discrete, localized regions of the portion of the medium containing the impurities. During recordal, a radiation beam is directed to each discrete region to be annealed, and the recording process is immediately checked for errors by sensing an electrical parameter of the discrete region as it is subjected to the radiation beam. The retrieval of information recorded on the medium is accomplished by scanning the annealed and non-annealed regions of the medium with a radiation beam and sensing an electrical parameter of each region.

An advantage of the invention is that the storage medium is inexpensive to produce.

Another advantage of the invention is that reflected laser light is not required, so that associated optics and detection circuitry are greatly simplified.

Another advantage of the invention is that information recorded on the storage medium has an expected lifetime in excess of 20 years.

Another advantage of the invention is that information is stored in discrete, localized regions of extremely small size, so that the storage capacity of the medium is extremely large.

A further advantage of the invention is that the time intervals required to anneal a discrete region of the medium and to sense an electrical parameter of the annealed and non-annealed regions are extremely small, so that transfer of information to and from the medium occurs at a very high rate.

A still further advantage of the invention is that error checking is immediate, taking place during recordal.

Other advantages and objects of the invention appear hereinafter.

For the purpose of illustrating the invention, there is shown in the drawings a form which is presently preferred; it being understood, however, that this invention is not limited to the precise arrangements and instrumentalities shown.

DETAILED DESCRIPTION OF THE INVENTION

Figure 1:
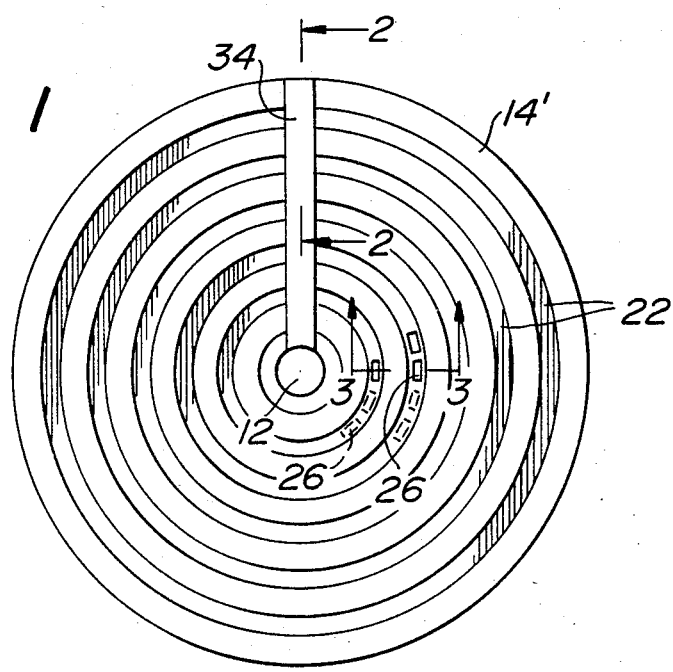
FIG. 1 is a plan view of the storage medium of the present invention employing circular electrodes on the medium surface.

Referring to the drawings wherein like numerals indicate like elements, there is shown in FIG. 1 an information storage medium 10 in accordance with the present invention. The medium 10 is preferably formed in the shape of a disk having a central opening 12 to facilitate mounting of the disk on a device which rotates the disk. Such devices are well-known in the optical disk information storage field and need not be described therein. Conductive electrodes 14 arranged in a spaced concentric pattern are formed on the top surface of the medium 10. The conductive electrodes 14 are applied to the top surface of the medium by photolithographic techniques well-known in the semi-conductor field.

Figure 2:
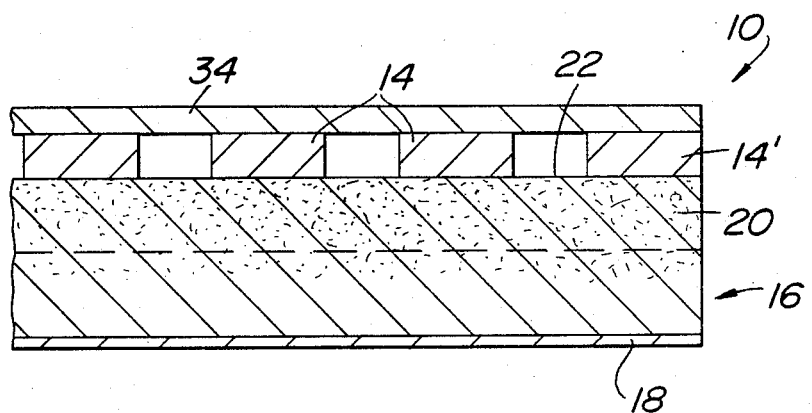
FIG. 2 is a cross-section of the storage medium taken along 2—2 in FIG. 1.

As shown in FIG. 2, the storage medium 10 comprises a semi-conductor wafer 16, preferably Si or other Group IV element, and a thin electrically conductive film 18 applied to the bottom surface of the wafer. The conductive electrodes 14, as well as the conductive film 18, may be made of Al or other suitable electric conductor. The Si wafer is preferably doped with an impurity, for example a Group III impurity such as B, and is subjected to an ion beam, for example a Group V impurity such as As, which introduces additional impurity ions and lattice defects in a portion 20 of the wafer near the wafer top surface. The p-n junction formed by doping and ion implanting the wafer is represented schematically by dashed lines in FIG. 2.

Ion implantation is a well-known technique for doping semiconductors and is described in detail in the literature. For example, see Carter and Grant, "Ion Implantation Of Semi-Conductors" (John Wiley & Sons, Inc. 1976). Details of such techniques are well-known and need not be described herein.

Ion implantation offers a simple, more accurate control of dopant concentration and p-n junction depth than doping by thermal diffusion. The junction depth can be effectively controlled by controlling a single variable, the energy of the ion beam. Ion implantation, however, produces lattice defects which affect the conductivity of the medium. Normally, an ion implanted semiconductor is annealed to remove lattice defects introduced by the ion implantation. For this purpose, the semiconductor is subjected to a temperature which anneals the entire ion implanted portion of the semiconductor. In the present invention, however, the semiconductor wafer is not annealed and the lattice defects are preserved until information is recorded on the medium as described more fully below.

The doped, ion implanted portion 20 of wafer 16 defines a disk-shaped volume in which the impurities and lattice defects are distributed. These defects can be selectively removed by annealing discrete, localized regions of wafer portion 20. An annealed region possesses a reduced resistivity. In the present invention, the localized change in resistivity introduced at an annealed region is used as the vehicle for recording and retrieving information. As described more fully hereinafter, the exposed areas 22 of the wafer top surface between adjacent electrodes 14 serve as information recording tracks. To record information, certain discrete regions of the recording tracks are selectively annealed while other discrete regions are left non-annealed.

Figure 3:
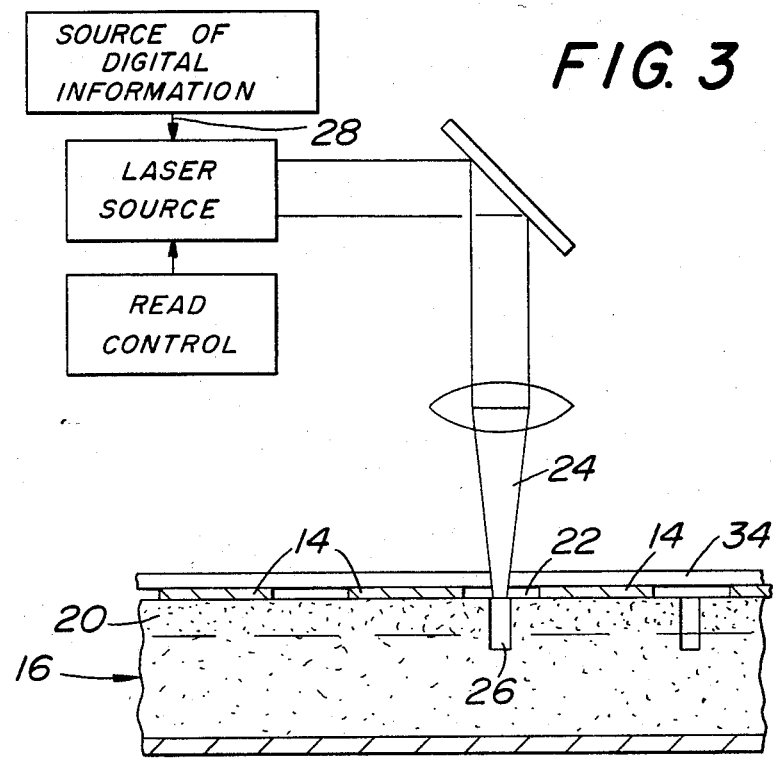
FIG. 3 is a diagram of the storage medium and laser source for recording of information on the medium.

As shown in FIG. 3, a radiation beam 24, preferably a focused laser beam, scans each recording track 22 to record information on the medium as the medium is rotated. The laser beam 24 steps from one recording track to another under control of a suitable device, such as a computer-controlled drive mechanism well known in the optical disk information storage field. The beam 24 is a relatively high powered beam having sufficient energy to anneal a discrete, localized region 26 of the doped ion implanted wafer portion 20 along a recording track. Preferably, the beam has sufficient energy to anneal the wafer to a depth slightly greater than the depth of the p-n junction.

Discrete, localized regions 26 within a recording track are sequentially annealed or left non-annealed by the laser beam 24 by modulating the beam, i.e. bv switching the beam to an energy level capable of annealing a discrete region when it is desired to store information such as a binary "1" and by switching the beam to an energy level incapable of annealing a discrete region when it is desired to store information such as a binary "0". Annealed regions along a recording track are shown in solid lines in FIG. 1. Non-annealed regions are shown in phantom. Beam modulation can be accomplished by switching the laser on and off in response to a control signal 28 representative of the digital information desired to be stored on the medium at each discrete region. Apparatus for generating the control signal and for modulating the laser accordingly is well-known in the optical disk information storage field and need not be described further herein.

To retrieve information recorded on the storage medium 10, the medium is rotated so that the laser beam 24 scans each recording track. The laser beam is stepped from one recording track to another as in the recording mode. During information retrieval, however, the focused laser beam 24 is altered so as to reduce the beam energy at the top surface of the wafer to a level incapable of annealing a discrete region but capable of exciting an annealed region so as to produce a photovoltaic signal which can be conveniently detected by a sensing device 30. For example, the beam energy may be reduced to approximately 10% of the energy level used to anneal a discrete region of the medium during recording. To initiate retrieval of information from medium 10, an operator-controlled device is activated to produce a control signal 32, which causes the laser source to drop the beam energy to the desired level for retrieving information.

Figure 4:
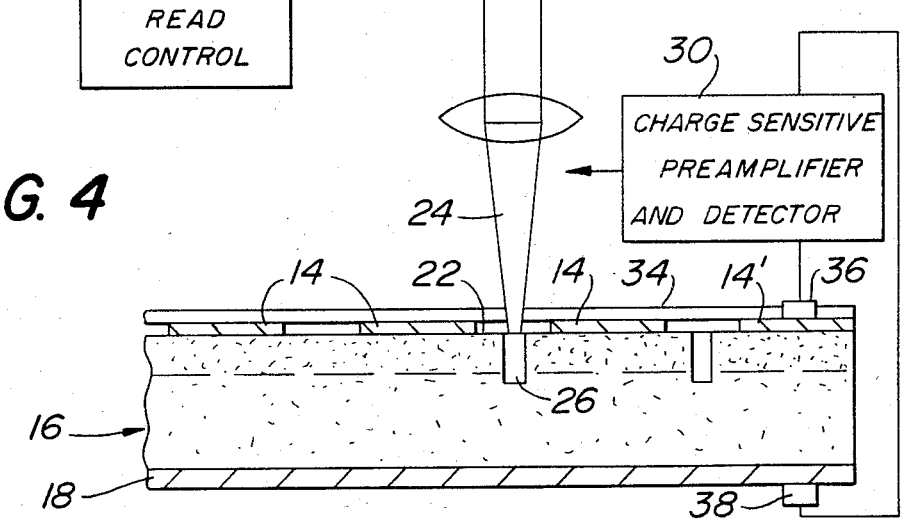
FIG. 4 is a diagram of the storage medium and sensing apparatus for retrieving information from the medium.

As shown in FIGS. 1 and 4, the conductive rings 14 are electrically connected together by a radial conductive strip 34, for example Al, which contacts a conductive ring 14' near the outer periphery of the medium. The preferred sensing device 30 comprises a charge sensitive preamplifier and detector. The preamplifier is electrically coupled to the conductive ring 14' and to the conductive film 18 by sliding contacts 36, 38 respectively. A charge sensitive preamplifier is preferred because it is capable of rapidly sensing the photovoltaic signals produced by annealed and non-annealed regions of the recording track as they are subjected to the reduced energy laser beam.

Each photovoltaic signal is generated at a conductive ring 14 adjacent a discrete region which is subjected to the reduced energy laser beam. The photovoltaic signals are sensed by device 30 since the conductive ring 14' is electrically connected to each conductive ring 14 by the radial conductive strip 34. The device 30 generates a bi-level signal, the signal level being determined by the strength of the photovoltaic signal generated at the discrete region. The strength of the photovoltaic signal is determined by the resistivity of the region. The resistivity of an annealed region is significantly less than that of a non-annealed region. The device 30 determines whether the photovoltaic signal falls within a preselected range, i.e. greater than some threshold level, which is indicative of an annealed region. The signal generated by device 30, then, represents a binary "1" or "0" depending on whether the discrete region is annealed or non-annealed.

Error checking is conveniently and rapidly accomplished by the sensing device 30 during recoeding of information. During annealing, a region produces an enhanced photovoltaic signal. The signal may be compared by the detector portion of device 30 to a threshold so as to generate a bi-level signal. For example, the device may generate a binary "1" when the threshold is exceeded and a different signal, for example a binary "0", when the threshold is not exceeded. The output of the sensing device 30 can be compared to a signal derived from control signal 28 which indicates the digital information which should be stored at each region if the recording process were error-free. A signal comparison circuit (not shown) can be employed for this purpose, the output of the comparison circuit indicating an error if the output of the sensing device does not match or coincide with the state of control signal 28.

EXAMPLE 1

A Si semiconductor wafer was uniformly doped with B, the doping level being approximately $2.0 \times 10^{15}$ cm$^3$, to form a p-type wafer having a surface resistivity of 5-9 ohms-cm. The wafer was ion implanted with As using an ion beam of $7.0 \times 10^{15}$ ions/cm$^2$ at 100 Kev. The peak concentration of As was $1.39 \times 10^{21}$ ions/cm$^3$ located at a depth of 0.07 micrometers from the wafer surface. The depth of the p-n junction, where the concentration of implanted As ions equaled the concentration of the uniformly dispersed B ions, was 0.22 micrometers. The junction depth is essentially the maximum depth that the implanted As ions contribute to the photovoltaic response. The doped ion implanted wafer was not annealed.

Information was recorded on the wafer by selectively annealing discrete, localized regions of the wafer. Annealing was accomplished by directing a ruby laser having a pulse width of 1.06 milliseconds with 3-7 joules per pulse and a wave length of 694.3 nanometers to the region on the wafer top surface. The laser was focused on an area of the wafer top surface having a diameter of 150 micrometers. The energy deposition at the surface region was approximately 170 microjoules/micrometers$^2$.

Retrieval of information was accomplished by directing a 5 milliwatt laser focused on an area of the wafer top surface having a diameter of 200 micrometers. The photovoltaic signal produced by an annealed region ranged from 0.34-3.54 millivolts compared to a photovoltaic signal of 0.1 millivolts for a non-annealed region.

During recordal of information, that is, during annealing of a region, enhanced photovoltaic signals up to 50 millivolts were detected.

EXAMPLE 2

Figure 5:
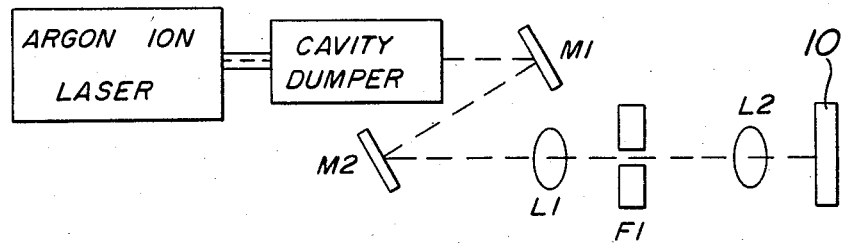
FIG. 5 is a detailed schematic of apparatus used to record information on the medium.

A doped, non-annealed, ion implanted Si wafer was exposed to a laser beam focused on a circular area on the wafer top surface having a diameter of 2-5 micrometers. The laser focusing system is shown in FIG. 5. The system comprised a Spectra Physics Model 164-09 Argon laser and a Spectra Physics Model 3445 cavity dumper, dielectric mirrors M1 and M2, a couble convex focusing lens L1, a spatial filter F1 mounted on a Jodan spatial filter manipulator, and a 10× microscope objective lens L2. The medium 10 was mounted on a X-Y translator stage. The Si wafer was doped with B and ion implanted with As ions. The p-n junction depth was approximately 0.21 micrometers below the wafer top surface. The focus laser beam annealed the 2-5 micrometer diameter areas to a depth greater than the p-n junction. Each laser pulse was 14 nanoseconds long with $10^{-9}$–$10^{-10}$ joules per pulse, so that several pulses were required to effect the annealing of each region.

Figure 6:
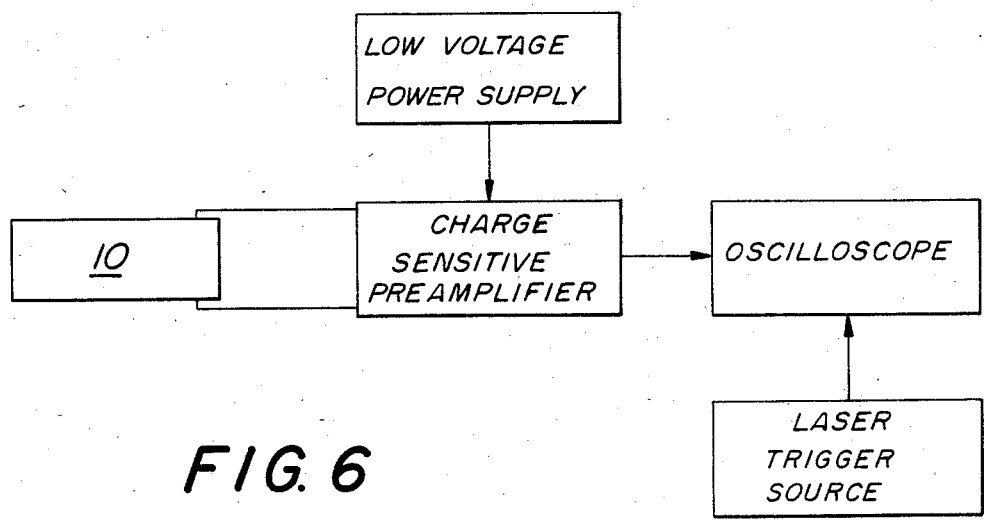
FIG. 6 is a detailed schematic of apparatus used to retrieve information from the medium.

To retrieve information from the medium, the focused laser beam energy was reduced to approximately 10% of the energy used to anneal a region. The beam scanned the annealed regions of the wafer. The resulting photovoltaic signal was amplified with a charge sensitive pre-amplifier and displayed on the screen of an oscilloscope. The electronics used to sense the photovoltaic signal are shown in FIG. 6.

Although the invention has been described in terms of a Si semiconductor wafer doped with Group III elements and ion implanted with Group V elements, it is also possible to produce the wafer by doping with Group V elements followed by ion implantation with Group III elements. Moreover, other Group IV elements than Si may be used as the semiconductor.

In addition, although it is preferred that the medium 10 be disc-shaped with circular recording tracks and rotated with respect to the radiation beam source, the invention is not so limited. Thus, the medium 10 need not be disc-shaped, the recording tracks need not be circular, and the radiation beam source may be moved while the medium is held stationary to effect recordal and retrieval of information.

In the embodiment described herein and shown in FIGS. 1 and 2, the conductive rings are preferably spaced by 10–50 micrometers and the laser beam source is focused to an area having a diameter of approximately 1 micrometer on the wafer surface. In addition, the laser beam used during recordal of information should have sufficient energy so as to heat a region to a temperature, for example approximately 400°–600° C., which results in annealing of the region. The energy of the laser beam used to retrieve information from the medium may be as low as 1–100th of the energy of the beam used to anneal a region.

Further, to assist annealing during recording information, the medium 10 may be pre-heated in an oven for example to 100° C., thereby permitting the energy of the laser beam to be reduced while ensuring annealing of the desired region.

The present invention may be embodied in other specific forms without departing from the spirit or essential attributes thereof and, accordingly, reference should be made to the appended claims, rather than to the foregoing specification, as indicating the scope of the invention.

I claim:

1. Information storage medium, comprising:
   a silicon semiconductor having a doped portion containing boron as a first impurity and arsenic as a second impurity and having a p-n junction, said doped portion containing non-annealed lattice defects, spaced conductive aluminum electrodes disposed in a circular concentric pattern so as to contact a surface of said doped portion on one side of said p-n junction,
   a conductive layer of material disposed so as to contact a surface of the semiconductor or another side of the said p-n junction.

2. Article for storing information in binary form, comprising:
   a semiconductor having a doped portion containing first and second impurities and p-n junction, said doped portion containing non-annealed lattice defects,
   spaced conductive electrodes disposed in a circular concentric pattern so as to contact a surface of said doped portion on one side of said p-n junction,
   at least one discrete, localized annealed region in said doped portion representative of one state of said binary form, and
   at least one discrete, non-annealed region in said doped portion representative of the other state of said binary form.

3. Article according to claim 2, wherein said semiconductor is silicon and said first and second impurities are boron and arsenic.

* * * * *

UNITED STATES PATENT AND TRADEMARK OFFICE
CERTIFICATE OF CORRECTION

PATENT NO. : 4,593,306

DATED : June 3, 1986

INVENTOR(S) : D. D. Marchant, Stefan Begej

It is certified that error appears in the above—identified patent and that said Letters Patent is hereby corrected as shown below:

Column 5, line 43, "during recoeding" should read — during recording —.
Column 8, line 7, "semiconductor or" should read — semiconductor on —.
Column 8, line 12, "and p-n" should read — and a p-n —.

Signed and Sealed this

Fifteenth Day of December, 1987

Attest:

DONALD J. QUIGG

Attesting Officer

Commissioner of Patents and Trademarks